United States Patent
Van Der Pasch et al.

(10) Patent No.: US 8,400,617 B2
(45) Date of Patent: Mar. 19, 2013

(54) LITHOGRAPHIC APPARATUS HAVING A SUBSTRATE SUPPORT WITH OPEN CELL PLASTIC FOAM PARTS

(75) Inventors: Engelbertus Antonius Fransiscus Van Der Pasch, Oirschot (NL); Dirk-Jan Bijvoet, Eindhoven (NL); Emiel Jozef Melanie Eussen, Eindhoven (NL); Igor Matheus Petronella Aarts, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 441 days.

(21) Appl. No.: 12/730,901

(22) Filed: Mar. 24, 2010

(65) Prior Publication Data
US 2010/0271611 A1   Oct. 28, 2010

Related U.S. Application Data

(60) Provisional application No. 61/172,588, filed on Apr. 24, 2009.

(51) Int. Cl.
  *G03B 27/58*  (2006.01)
  *G03B 27/42*  (2006.01)
  *G03B 27/62*  (2006.01)
(52) U.S. Cl. ............... 355/72; 355/53; 355/75
(58) Field of Classification Search .......... 355/52, 355/53, 55, 72–75; 250/442.11, 492.1, 492.2, 250/492.22, 548
See application file for complete search history.

(56) References Cited

U.S. PATENT DOCUMENTS

| | | | | |
|---|---|---|---|---|
| 5,275,796 | A  * | 1/1994 | Tillotson et al. | 423/338 |
| 5,311,282 | A | 5/1994 | Someya et al. | |
| 5,691,806 | A  * | 11/1997 | Tokuda et al. | 355/72 |
| 5,789,075 | A  * | 8/1998 | Frank et al. | 428/312.6 |
| 6,020,390 | A | 2/2000 | Leenslag | |
| 6,714,278 | B2 * | 3/2004 | Kamiya | 355/30 |
| 6,810,298 | B2 | 10/2004 | Emoto | |
| 7,417,714 | B2 * | 8/2008 | Binnard et al. | 355/72 |
| 7,649,611 | B2 | 1/2010 | Zaal et al. | |
| 7,663,127 | B2 * | 2/2010 | Wood et al. | 250/503.1 |
| 7,767,985 | B2 * | 8/2010 | Okoroanyanwu et al. | 250/492.2 |
| 2002/0159046 | A1 * | 10/2002 | Binnard et al. | 355/74 |
| 2004/0121096 | A1 * | 6/2004 | Asmussen | 428/34.1 |
| 2005/0029981 | A1 * | 2/2005 | del Puerto | 318/649 |
| 2005/0036126 | A1 * | 2/2005 | Kubo | 355/72 |
| 2006/0017893 | A1 * | 1/2006 | Mertens et al. | 355/30 |

(Continued)

FOREIGN PATENT DOCUMENTS

| | | |
|---|---|---|
| JP | 06-045215 | 2/1994 |
| JP | 09-504749 | 5/1997 |

(Continued)

OTHER PUBLICATIONS

Japanese Office Action mailed Jan. 31, 2012 in corresponding Japanese Patent Application No. 2010-094525.

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A lithographic apparatus includes an illumination system configured to condition a radiation beam, a support constructed to support a patterning device, the patterning device being capable of imparting the radiation beam with a pattern in its cross-section to form a patterned radiation beam, a substrate support constructed to hold a substrate, and a projection system configured to project the patterned radiation beam onto a target portion of the substrate, wherein the substrate support includes parts that are made of an open cell plastic foam material.

17 Claims, 3 Drawing Sheets

U.S. PATENT DOCUMENTS

| | | |
|---|---|---|
| 2007/0153244 A1* | 7/2007 | Maria Zaal et al. ............. 355/30 |
| 2008/0113491 A1* | 5/2008 | Wood et al. .................... 438/460 |
| 2008/0137055 A1* | 6/2008 | Hennus et al. .................. 355/72 |

FOREIGN PATENT DOCUMENTS

| | | |
|---|---|---|
| JP | 10-209040 | 8/1998 |
| JP | 2001-018246 | 1/2001 |
| JP | 2001-504150 | 3/2001 |
| JP | 2001-290543 | 10/2001 |
| JP | 2006-064507 | 3/2006 |
| JP | 2006-165523 | 6/2006 |
| JP | 2007-194618 | 8/2007 |
| JP | 2009-002862 | 1/2009 |
| WO | 97/02217 | 1/1997 |

\* cited by examiner

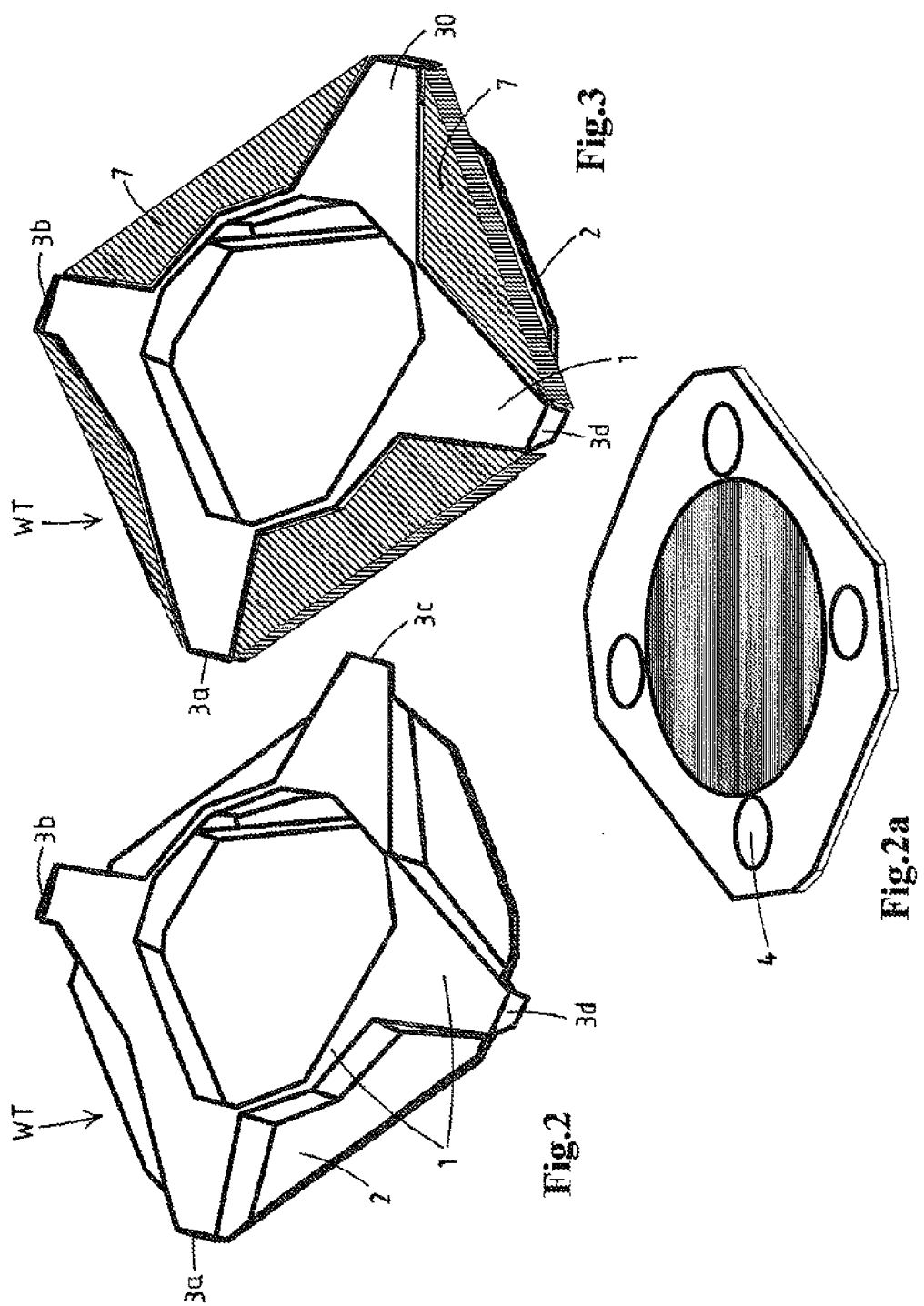

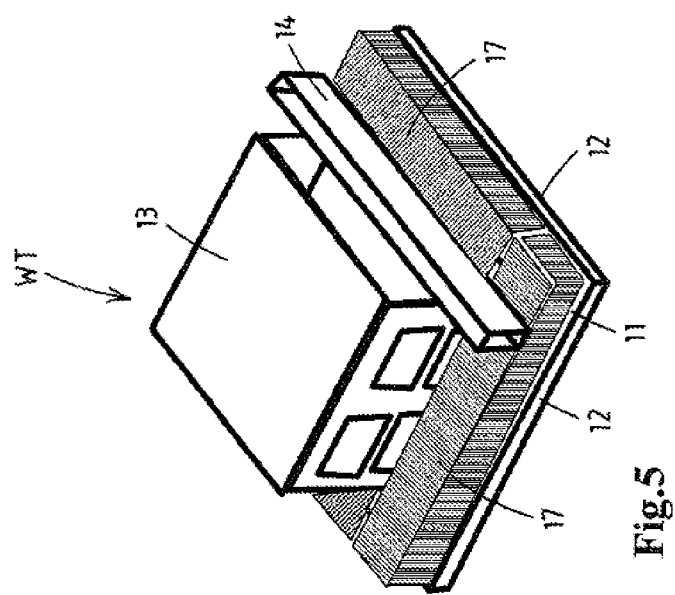
Fig.5
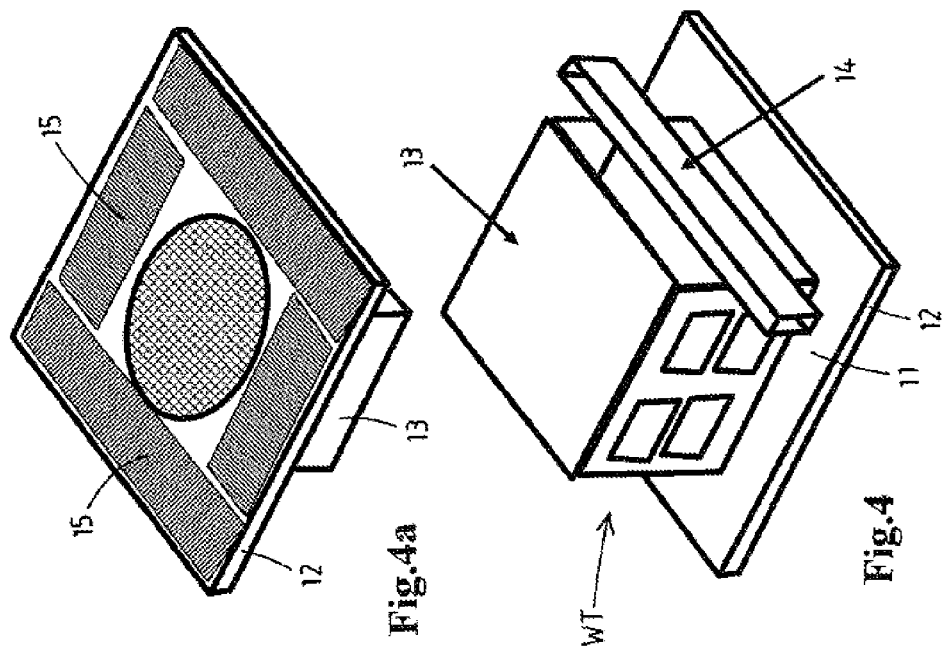
Fig.4a
Fig.4

LITHOGRAPHIC APPARATUS HAVING A SUBSTRATE SUPPORT WITH OPEN CELL PLASTIC FOAM PARTS

CROSS REFERENCE TO RELATED APPLICATIONS

This application claims priority and benefit under 35 U.S.C. §119(e) to U.S. Provisional Patent Application No. 61/172,588, entitled "Lithographic Apparatus Having A Substrate Support With Open Cell Plastic Foam Parts", filed on Apr. 24, 2009. The content of that application is incorporated herein in its entirety by reference.

FIELD

The present invention relates to a lithographic apparatus having a specific substrate support construction, and to a substrate support for use in such a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During a lithographic process, the substrate is supported on a movable substrate support. With this, a position measurement system is used for determining positions of the support during calibration and/or during the lithographic process itself. A known position measurement system includes an encoder system with four encoders which are positioned at the respective corners of a table of the substrate support. During position measurement a frequent switching needs to take place between the four encoders. This is desirable in order to each time have at least three of the encoders not being blocked by a lens or other part of the apparatus with the table moving there below. The switching requires consistency between the sensors, that is to say no matter which of the sensors are functional at a specific moment in time, together they will always indicate the correct position. The consistency in turn requires the substrate support to be low sensitive to thermal changes. For this it is known to manufacture the substrate support out of a low expansion material, for example a material called Zerodur. In order to at the same time be able to have the support obtain high accelerations during the lithographic process, the support is made as light weight as possible. This for example is done by making the table of the support be relatively thin walled and/or to design it with a ribbed structure with strengthening ribs delimiting thin walled panels there between.

During a lithographic process the substrate support is thermally polluted by heat coming for example from its the long stroke drive motor. Warm air coming from this long stroke drive motor moves upward and heats up the rest of the substrate support. Especially the strengthening ribs and thin walled panels extending between the encoders may expand because of this thermal pollution. The relative thin walled substrate table will react fast on temperature changes in the surrounding. Even though the chuck is made of low expansion material, it still has appeared that this tends to reduce the consistency between the sensors. For example a temperature change of 100 mK and distances between the respective sensors of approximately 0.5 m, with a material like Zerodur leads to 1 nm like position changes, of which approximately 70% goes into inconsistency between the respective sensors. For exposure/readout intervals of the substrate during a lithographic process of 2 minutes or more, this may introduce errors in the position measurement in the order of 0.5 nm-1 nm.

Another known position measurement system includes a substrate support table with gratings and/or interferometer mirrors extending over substantially the entire lengths of its circumferential side walls. When using such a support table equipped with interferometer mirrors and grating plates, the problem of thermal pollution leading to errors in the position measurements of both systems during a lithographic process can be even bigger because the two systems can react differently on thermal pollution, and therefore using the output of both two systems can lead to different calculated support positions. It has been tried to strengthen the side walls with strengthening ribs in order to diminish its thermal expansion behaviour somewhat. However, even then the expansion still occurs to be too large. Furthermore, strengthening of the side edges by for example making the Zerodur table thicker at these side edges, would make the total substrate support too heavy for it to be able to achieve the desired high accelerations.

SUMMARY

An aspect of the invention aims to provide a construction for the substrate support which is both lightweight and stiff, while at the same time it has a reduced thermal sensitivity such that is largely insensitive to thermal influences with respect to a proper supporting of a substrate during a lithographic process and with respect to a proper functioning of position indicators provided on the substrate support.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate support constructed to hold a substrate; and a projection system configured to project the patterned radiation beam onto a target portion of the substrate, wherein the substrate support includes parts made of an open cell plastic foam material.

In another embodiment of the invention, there is provided a substrate support constructed to hold a substrate during a lithographic process, wherein the support includes parts made out of an open cell plastic foam material.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 shows a bottom view of an embodiment of the wafer table of FIG. 1 according to state of the art;

FIG. 2a shows a top view of FIG. 2;

FIG. 3 shows the bottom view of the substrate table of FIG. 2 with integrated open cell plastic foam material parts according to an embodiment of the invention;

FIG. 4 shows a bottom view of an alternative embodiment of the substrate table of FIG. 1 according to state of the art;

FIG. 4a is a top view of FIG. 4; and

FIG. 5 shows the bottom view of the substrate table of FIG. 4 with integrated open cell plastic foam material parts according to an embodiment of the invention.

DETAILED DESCRIPTION

Figure 1:
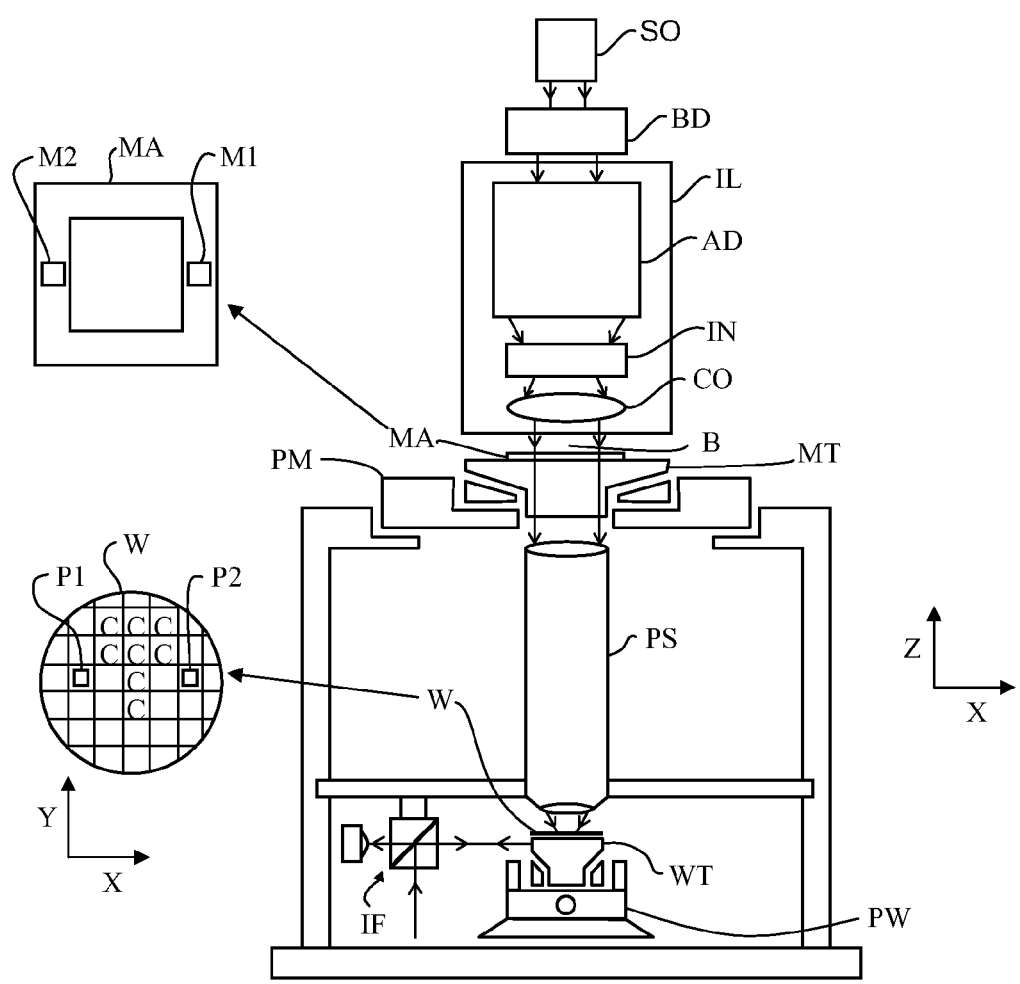
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In FIG. 2 an embodiment of the substrate table (e.g. wafer support table) WT of FIG. 1 has been shown in more detail in a view from below. The table WT includes a ribbed structure with a plurality of ribs 1 with substantially flat panels 2 extending between them. Together the panels form a substantially rectangular shaped surface with four corner positions 3a-d slightly projecting sideways. At each of these corner positions 3a-d a position indicator 4 is mounted (see FIG. 2a). This position indicator for example is an encoder or a complementary grid part for such an encoder. The known substrate table WT is manufactured out of Zerodur. This material is known to have a low thermal expansion, good homogeneity and processing behaviour. It has aluminum like density of approximately 2530 kg/m3. Thus, Zerodur can well be used as material for the movable wafer table which at the same time must be light weight and stiff. Lightweight can be created by using thin walls. Nevertheless, the thermal behaviour of the table WT still leaves to be improved, particularly with the ever increasing demands on processing times and accuracy.

In FIG. 3, the substrate table WT again includes a lattice construction with ribs 1 and panels 2 some of which extend as strengthening parts between the corner positions 3a-d of the table WT. The ribs 1 and panels 2 are made from a light weight glass ceramic material, for example the abovementioned Zerodur. According to an embodiment of the invention, n the table WT now further includes parts 7 which are made out of an open cell plastic foam material. The parts 7 here are strips which extend between the respective corner positions 3a-d and which lie against the bottom side of those ribs 1 and panels 2 which also extend between the corner positions 3a-d. Thus the parts 7 directly shield off those ribs 1 and panels 2 in the downward direction. The open cell plastic foam material is a good thermal insulator. Because of this the parts 7 are perfectly able to properly thermally isolate some of the most critical parts of the table WT, for example, those ribs 1 and panels 2 which extend between the corner positions 3a-d. These ribs 1 and panels 2 extending between the corner positions 3a-d are directly shielded off from heat dissipation sources below the wafer table WT. These heat dissipation sources for example may be drive motors for the table WT (so-called Long Stroke and/or Short Stroke drive motors). The thermal insulation by the parts 7 prevents the ribs 1 and panels 2 shielded by them from excessive heating up and thermally expanding during a lithography process. This has the immediate benefit of making the wafer positioning more stable and accurate, and of making the position indicators more consistent with each other and to provide for a more accurate position measurement. Thus the matching performance of the entire lithographic apparatus is increased. The open cell plastic foam material parts 7 do not only shield off some of the critical parts of the wafer table WT, but at the same time may locally strengthen the table WT. If desired this makes it possible to even make some other parts of the table WT, in particular the ribs 1 and panels 2 which are shielded off by the parts 7, somewhat thinner and thus more light weight.

Since the open cell plastic material parts 7 are also very light weight, they do no add much weight to the table. In some cases it may even be possible to lower the total weight of the table WT somewhat owing to the use of the open cell plastic foam material parts 7. This makes it possible to obtain higher accelerations of the table WT during a lithographic process.

In particular the open cell plastic foam material is chosen with a density which is at least 20 times smaller than the density of the ribs 1 and panels 2. More in particular the open cell plastic foam material is chosen with a density which is less than 100 kg/m3. In an embodiment, the open cell plastic foam material has an E-modulus of less than 1.0E+06 N/m2. In an embodiment, the density of the open cell plastic foam material is at least 20 times smaller than the density of the strengthening parts. In an embodiment, the E-modulus of the open cell plastic foam material is at least 50 times smaller than the E-modulus of the strengthening parts.

Thus the open cell plastic foam material parts 7 perfectly aid in providing a substrate table WT which is both light weight and stiff at the same time while not suffering from negative effects because of thermal pollution.

Preferably the open cell plastic foam material parts 7 are made from an aerogel. Aerogel is a light weight but rigid foam which is derived from a gel in which the liquid component has been replaced with gas. Aerogel has a density of less than 100 kg/m3, and even may have a density which is close to the density of air which is approximately 1.2 mg/cm3. The result is an extremely low density solid (light weight) which owing to a porous dendritic microstructure is able to bear high loads, while at the same time it is a very effective thermal insulator. In fact, aerogel depending on its composition is able to almost nullify the three methods of heat transfer, that is to say convection, conduction and radiation.

In an embodiment, the parts 7 are made from a silica aerogel. The silica makes the parts 7 especially good conductive insulators because silica is a poor conductor of heat. In a further embodiment, the parts 7 are made from a carbon aerogel. The carbon makes the parts 7 good radiative insulators because carbon absorbs infrared radiation. In an even further embodiment, the parts 7 are made from a silica aerogel with carbon added to it. Thus the parts 7 may be both good conductive and radiative insulators at the same time.

In an embodiment, the parts 7 are made water resistant by providing them with a water resistant outer coating. It is also possible to make the parts 7 hydrophobic by means of a suitable chemical treatment. This chemical treatment preferably makes substantially the entire interior of the open cell foam structure of the parts 7 hydrophobic and thus less susceptible to degradation even when a crack or other damage would occur to their outer surface.

In FIG. 4, an alternative embodiment of a substrate table WT is schematically shown in a view from below. The table WT includes a substantially rectangular shaped panel 11 with side walls 12. In the middle of the panel 11a driving unit 13 is provided which is able to position the substrate table, in particular in 6 degrees of freedom. Along the entire length of each side wall 12, a plurality of interferometer mirrors 14 is mounted. On the upper side of the panel 11 near the outer side edges thereof and also extending over the entire length of each outer side edge, encoder grating plates 15 are mounted (see FIG. 4a). This known substrate table WT is also manufactured out of Zerodur. However, as indicated in the introduction to the description, here thermal pollution and resulting thermal expansion leading to errors in the position measurement during a lithographic process is even bigger, because these errors may be difficult or even impossible to be calibrated for.

In FIG. 5, the substrate table WT again includes a panel 11 which is made from a light weight glass ceramic material, for example the abovementioned Zerodur. According to an embodiment of the invention, the table WT further includes parts 17 which are made out of an open cell plastic foam material, in particular aerogel. The parts 17 cover the entire circumferential side edge parts of the panel 11 and at these positions lie against the bottom side of the panel 11. Thus the parts 17 directly shield off the most critical side edge parts of the panel 11 at the other side of which the encoder grating plates 15 are mounted, and along the side walls of which the interferometers mirrors 14 are mounted. Again the most critical parts of the table WT are efficiently thermally isolated by being directly shielded off from heat dissipation sources below the substrate table WT. Heat sources from below do no longer lead to errors in the position measurement with the aid of the mirrors and grating along the side edges during a lithographic process. Hardly, any inhomogeneous expansion dependant on the position of the gratings and/or interferometer mirrors along these side walls takes place along the length of the side walls. Strengthening of the side walls with strengthening ribs in order to diminish further thermal expansion behaviour is no longer necessary. The substrate table WT may even be made more light weight and stiff owing to the filling of its critical thermal areas with the open cell plastic foam material parts 17.

Besides the embodiments shown numerous variants are possible. For example the substrate table may have other shapes. Also, it is possible to use other types of position indicators. Furthermore, other parts of the substrate table or substrate support may also be filled/covered with the light weight thermally insulating open cell plastic foam material. In addition or as an alternative to being mounted directly against the bottom side of the substrate table, the material can be mounted to the long stroke drive of the substrate support with close distance (a few millimeters) to the short stroke or can directly be mounted to the short stroke drive. It is also possible to entirely replace some of the critical parts, for example the panels between the ribs, by open cell plastic foam material parts. Also it is possible to stiffen the ribs by thickening them with the open cell plastic foam parts. Instead of aerogel, other open cell plastic foam materials may also be used. Instead of thermally insulating open cell plastic foam materials, it is also possible to use open cell plastic foam materials which are (extremely) light weight while at the same time being able to absorb a considerable amount of heat. Instead of Zerodur for the rest of the substrate table, other materials or other glass ceramics may also be used.

Thus, according to an embodiment of the invention, it is possible to construct a substrate support of a lithographic apparatus with a thin-walled (Zerodur) lattice construction having only a small thermal mass, by shielding of the most critical parts of this lattice construction, that is to say the parts between and along position measurement systems mounted thereto, with extremely light weight and superb thermal insulating open cell plastic foam material parts.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate support constructed to hold a substrate; and
   a projection system configured to project the patterned radiation beam onto a target portion of the substrate,
   wherein the substrate support comprises a part made of an open cell plastic foam material, and
   wherein the open cell plastic foam material is provided without an outer coating.

2. The lithographic apparatus of claim 1, wherein the open cell plastic foam material is an aerogel.

3. The lithographic apparatus of claim 1, wherein the open cell plastic foam material has a density of less than 100 kg/m$^3$.

4. The lithographic apparatus of claim 1, wherein the open cell plastic foam material has an E-modulus of less than 1.0E+06 N/m$^2$.

5. The lithographic apparatus of claim 1, wherein position indicators are present on the substrate support, between which position indicators open cell plastic foam parts at least partly extend.

6. The lithographic apparatus of claim 1, wherein the open cell plastic foam part is chemically treated, to become hydrophobic.

7. The lithographic apparatus of claim 1, including strengthening parts extending at least partly along and/or between position indicators on the substrate support, wherein the density of the open cell plastic foam material is at least 20 times smaller than the density of the strengthening parts.

8. The lithographic apparatus of claim 1, including strengthening parts extending at least partly along and between position indicators on the substrate support, wherein the E-modulus of the open cell plastic foam material is at least 50 times smaller than the E-modulus of the strengthening parts.

9. The lithographic apparatus of claim 1, wherein the substrate support further comprises glass-ceramic parts.

10. The lithographic apparatus of claim 1, wherein the substrate support includes encoder heads, encoder gratings and/or interferometer mirrors.

11. The lithographic apparatus of claim 1, wherein the open cell plastic foam material is arranged on the substrate support at one or more locations to thermally insulate one or more portions of the substrate support from heat generated by a motor configured to position the substrate support.

12. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate support constructed to hold a substrate; and
    a projection system configured to project the patterned radiation beam onto a target portion of the substrate,
    wherein the substrate support comprises a part made of an open cell plastic foam material, and wherein the substrate support comprises a table with a ribbed structure including ribs delimiting panels, at least some of the panels being made of the open cell plastic foam material.

13. The lithographic apparatus of claim 12, wherein the ribs are stiffened by thickening them with the open cell plastic foam parts.

14. A substrate support constructed to hold a substrate during a lithographic process, the support comprising a part made of an open cell plastic foam material, wherein the open cell plastic foam material is provided without an outer coating.

15. The substrate support of claim 14, wherein the open cell plastic foam material is arranged on the substrate support at one or more locations to thermally insulate one or more portions of the substrate support from heat generated by a motor configured to position the substrate support.

16. Substrate support constructed to hold a substrate during a lithographic process, the support comprising a part made of an open cell plastic foam material and a table with a ribbed structure including ribs delimiting panels, at least some of the panels being made of the open cell plastic foam material.

17. The substrate support of claim 16, wherein the ribs are stiffened by thickening them with the open cell plastic foam parts.

* * * * *